US010923330B2

(12) United States Patent
Legein et al.

(10) Patent No.: US 10,923,330 B2
(45) Date of Patent: Feb. 16, 2021

(54) SURFACE POLYMER COATINGS

(71) Applicant: Europlasma NV, Oudenaarde (BE)

(72) Inventors: Filip Legein, Keerbergen (BE); Frank Ferdinandi, Linton (GB)

(73) Assignee: Europlasma NV, Oudenaarde (BE)

( * ) Notice: Subject to any disclaimer, the term of this patent is extended or adjusted under 35 U.S.C. 154(b) by 0 days.

(21) Appl. No.: 16/517,523

(22) Filed: Jul. 19, 2019

(65) Prior Publication Data

US 2019/0393020 A1 Dec. 26, 2019

Related U.S. Application Data

(62) Division of application No. 14/343,474, filed as application No. PCT/GB2012/052201 on Sep. 7, 2012, now abandoned.

(30) Foreign Application Priority Data

Sep. 7, 2011 (GB) .................................. 1115465.5

(51) Int. Cl.
| | |
|---|---|
| *H01J 37/32* | (2006.01) |
| *C08F 2/52* | (2006.01) |
| *B05D 1/00* | (2006.01) |
| *H05K 3/28* | (2006.01) |
| *B05D 5/08* | (2006.01) |

(52) U.S. Cl.
CPC .......... *H01J 37/32532* (2013.01); *B05D 1/62* (2013.01); *C08F 2/52* (2013.01); *H01J 37/32082* (2013.01); *H01J 37/32403* (2013.01); *H01J 37/32522* (2013.01); *H01J 37/32541* (2013.01); *H01J 37/32568* (2013.01); *H05K 3/282* (2013.01); *B05D 5/083* (2013.01); *H05K 2203/095* (2013.01); *Y10T 428/265* (2015.01)

(58) Field of Classification Search
CPC .................................................. C23C 16/505
See application file for complete search history.

(56) References Cited

U.S. PATENT DOCUMENTS

| | | |
|---|---|---|
| 4,282,077 A | 8/1981 | Reavill |
| 4,381,965 A | 5/1983 | Maher, Jr. et al. |
| 4,826,585 A * | 5/1989 | Davis .................. C23C 16/5096 118/723 E |

(Continued)

FOREIGN PATENT DOCUMENTS

| | | |
|---|---|---|
| EP | 1130948 A1 | 9/2001 |
| WO | 9858117 A1 | 12/1998 |
| WO | 2011089009 A1 | 7/2011 |

OTHER PUBLICATIONS

International Search Report for PCT/GB2012/052201 dated Mar. 28, 2013.

*Primary Examiner* — Joseph A Miller, Jr.
(74) *Attorney, Agent, or Firm* — Caesar Rivise, PC (57) ABSTRACT

A plasma chamber (11') for coating a substrate with a polymer layer, the plasma chamber includes a first electrode set (14') and a second electrode set (14'), the first and second electrode sets are arranged either side of a sample chamber for receiving a substrate, wherein the first and second electrode sets include plural electrode layers (141', 142') and wherein each electrode set includes plural radiofrequency electrode layers or plural ground electrode layers for coating polymer to each surface of a substrate.

10 Claims, 7 Drawing Sheets

(56) References Cited

U.S. PATENT DOCUMENTS

| | | | |
|---|---|---|---|
| 5,593,550 A | 1/1997 | Stewart et al. | |
| 6,279,504 B1* | 8/2001 | Takaki | H01J 37/32082 118/723 E |
| 2001/0008782 A1* | 7/2001 | Matsuyama | C23C 16/0272 438/164 |
| 2003/0184234 A1 | 10/2003 | Hsu et al. | |
| 2004/0152381 A1* | 8/2004 | York | D06M 10/025 442/76 |
| 2004/0238124 A1* | 12/2004 | Nakamura | C23C 16/45595 156/345.43 |
| 2004/0247886 A1* | 12/2004 | Kudo | B05D 1/62 428/421 |
| 2005/0211170 A1 | 9/2005 | Hanawa et al. | |
| 2006/0162741 A1* | 7/2006 | Kurunczi | B01L 13/02 134/1.1 |
| 2006/0163201 A1 | 7/2006 | Getty et al. | |
| 2006/0191480 A1 | 8/2006 | Kishimoto et al. | |
| 2008/0008640 A1 | 1/2008 | Watanabe et al. | |
| 2008/0083732 A1 | 4/2008 | Shinma et al. | |
| 2009/0148624 A1 | 6/2009 | Takagi et al. | |

\* cited by examiner

SURFACE POLYMER COATINGS

CROSS-REFERENCE TO RELATED APPLICATIONS

This application is a division of U.S. application Ser. No. 14/343,474, filed May 9, 2014, which is a U.S. national phase of PCT/GB2012/052201, filed Sep. 7, 2012, which claims priority from GB 1115465.5, filed Sep. 7, 2011, the contents of which applications are incorporated by reference herein in their entireties.

BACKGROUND OF THE INVENTION

The present invention relates to surface coatings and is especially, but not exclusively, related to apparatus and methods for depositing polymer coatings onto a surface of a substrate such as a printed circuit board.

A printed circuit board (PCB) comprises an insulating material on which conductive tracks lie. The tracks are typically made of copper and function as wires between electrical components that are subsequently attached to the board, e.g. by soldering.

It is known in the art to coat PCBs and hence the tracks in order to protect the tracks from the environment, e.g. to inhibit or prevent oxidation of the tracks.

It is also known in the art to provide solder through polymer coatings so that an electrical component may subsequently be connected to the tracks of a PCB without first having to remove the protective coating.

Prior art methods of depositing the protective coating describe polymerising fluorocarbon gas precursors such as tetrafluoromethane ($CF_4$), hexafluoroethane ($C_2F_6$), hexafluoropropylene ($C_3F_6$) or octafluoropropane ($C_3F_8$) using plasma deposition techniques. These methods lay down a layer of halo carbon polymer coating for protective purposes. One such method is described in WO 2008/102113.

However, this particular class of precursor molecules requires high power plasma techniques in order to initiate the polymerisation reaction. Moreover, such precursor molecules require high precursor gas flow rates and long deposition times in order to obtain an acceptable thickness of the polymer deposition. An acceptable rate of polymer deposition is one which results in a coating that protects the conductive tracks from the corrosive environments that a PCB may encounter during its life cycle.

A problem that may arise when using high precursor gas flow rates and/or high power plasma is that the resultant polymer coatings have a non-uniform thickness. For instance, high power plasma causes monomers to fragment which can result in unpredictable deposition of the polymer and hence substandard coatings. Non-uniform deposition can lead to non-uniform thicknesses which are disadvantageous because they can be extremely difficult to solder through and/or may generate areas of insufficient, limited or no coating coverage. A more uniform coating is very important for high volume soldering operations, for example, because it gives more consistent solder joints with fewer defects.

Another problem that may arise when utilising precursor molecules such as those described above is that the subsequently formed polymer layer has limited hydrophobicity and oleophobicity. Typical contact angles for water that can be achieved with such coatings are maximum 90 to 100 degrees. The resistance to oil is also limited to maximum level 3 to 4 according to ISO14419. But PCBs are often required in devices used in hostile environments, such as where corrosion or abrasion of the conductive tracks may lead to a far shorter lifetime of the electrical circuit than would normally be expected. Therefore, it is desirable to provide a coating with higher levels of hydrophobicity and/or oleophobicity.

Another problem with conventional methods is that they lack means to control the rate in which precursor flows into the plasma chamber. Prior art methods typically adopt a "flow-through" process, which means that monomer is drawn in through an inlet port, flows through the plasma zone (i.e. the sample chamber) and is extracted through an exhaust port in a constant manner. As a consequence, the concentration of precursor is not homogenous throughout the chamber which may result in areas of the substrate with insufficient, limited or no coating coverage.

OBJECTS OF THE INVENTION

It is a first non-exclusive object of the present invention to provide apparatus and a method for depositing a solder-through polymer layer having a more uniform thickness across a substrate and/or better adhesion to a substrate than that known in the prior art.

It is a second non-exclusive object of the present invention to provide apparatus and a method for depositing a solder-through polymer layer onto a substrate such as a PCB, the polymer layer demonstrating superhydrophobic and/or oleophobic properties.

It is a further non-exclusive object of the present invention to provide a method for depositing a solder-through polymer layer onto a substrate, the method utilising low plasma power and/or low monomer flow rates. It is a further object to provide more resilient layers, layers with one or more of better in situ performance, increased uniformity, better solderability, improved wettability, improved oil and water repellency.

BRIEF SUMMARY OF THE INVENTION

A first aspect of the present invention provides a plasma chamber for coating a substrate with a polymer layer, the plasma chamber comprising a first electrode set and a second electrode set, the first and second electrode sets being arranged either side of a sample chamber for receiving a substrate, wherein the first and second electrode sets comprise electrode layers and wherein each electrode set comprises plural radiofrequency electrode layers or plural ground electrode layers for coating polymer to each surface of a substrate.

The electrode layers are preferably of a planar or plate form. One advantage of such a configuration is that the generated plasma is substantially even across the surface of the electrode set. Consequently, the rate of polymerisation of monomer onto the substrate is the same at any given point on the substrate resulting in increased uniformity and so on.

Preferably, one or both of the first and second electrode sets comprise an inner electrode layer and a pair of outer electrode layers.

Preferably, the inner electrode layer is a radiofrequency electrode and the outer electrode layers are ground electrodes.

Alternatively, the inner electrode layer may be a ground electrode and the outer electrode layers may be radiofrequency electrodes.

When the inner and/or outer electrode layer or electrode layers are of the radiofrequency type, the or each electrode layer may comprise a heat regulator, e.g. a substantially flat or channel portion for receiving a regulator fluid.

When the inner and/or outer electrode layer or electrode layers are of the ground type, the or each electrode need not comprise a heat regulator. Thus, electrode layers of this type may simply comprise a plate, mesh or other configuration suitable for generating the plasma.

Preferably, the heat regulator comprises hollow tubing. The hollow tubing may follow a path which curves upon itself by approximately 180° at regular intervals to provide an electrode that is substantially planar in dimension.

Preferably, the hollow tubing comprises a diameter of from approximately 2.5 to 100 mm, more preferably from approximately 5 to 50 mm, even more preferably from approximately 5 to 30 mm, say up to 25, 20 or 15 mm, for example 10 mm.

Preferably, the hollow tubing has a wall thickness of from approximately 0.1 to 10 mm, more preferably from approximately 0.25 to 5 mm, even more preferably from approximately 0.25 to 2.5 mm, say 1.5 mm.

Preferably, the distance between the hollow tubing before and after the curve is between 1 and 10 times the diameter of the tubing, say around 3 to 8, for example 5 times the diameter of the tubing.

Preferably, the hollow tubing comprises a conductive material such as a metal, e.g. aluminium, stainless steel or copper. Other suitable conductive materials may be envisaged.

Preferably, the hollow tubing is fed with a fluid such as a liquid such as water, oil or other liquids or combinations thereof.

Preferably, the fluid can be cooled or heated so that the plasma can be regulated over a wide temperature range, e.g. from 5 to 200° C.

Preferably, the fluid regulates the plasma at a temperature of from approximately 20 to 90° C., more preferably from approximately 25 to 60° C., even more preferably from approximately 30 to 40° C.

Preferably, the plasma chamber is temperature controlled, e.g. to avoid temperature differentials within the chamber, and to avoid cold spots where the process gas can condensate.

For instance, the door, and some or each wall(s) of the vacuum chamber may be provided with temperature control means.

Preferably, the temperature control means maintains the temperature from room temperature to 70° C., more preferably from between 30 and 50° C.

Preferably, also the pump, the liquid monomer supply and all connections between those items and the plasma chamber are temperature controlled as well to avoid cold spots where the process gas or gases can condense.

Preferably, the power is applied across the radiofrequency electrode or electrodes via one or more connecting plates.

Preferably, the applied power is approximately 5 to 5000 W, more preferably approximately 5 to 500 W, even more preferably approximately, say 10 to 250 W, for example 20 to 150 W, say 70 W.

The power may be applied continuously or in pulsed power mode.

When in pulsed power mode, the pulse repetition frequency may be from 100 Hz to 10 kHz having a duty cycle from approximately 0.05 to 50%, with the optimum parameters being dependent on the monomer used.

Preferably, the radiofrequency electrode or electrodes generate a high frequency electric field at frequencies of from 20 kHz to 2.45 GHz, more preferably of from 40 kHz to 13.56 MHz, with 13.56 MHz being preferred.

Preferably, the plasma chamber comprises further electrode sets, for example third, fourth, fifth and sixth electrode sets and so on.

Preferably, the electrode sets are arranged successively from one end of the plasma chamber to an opposed end of the plasma chamber.

Preferably, the electrode sets closest to each end of the plasma chamber comprise at least three electrode layers, e.g. three electrode layers.

The position of the electrode sets is adjustable by design so as to accommodate samples of differing size and also to vary the width of the plasma zone. For instance, in cases where two sets are close to one another the plasma zone is narrow. By moving the two sets apart the width of the plasma zone is increased.

The or each further electrode set may comprise the same architecture as the first and second electrode sets.

Preferably, the plasma chamber further comprises locating and/or securing means such as one or more connecting plates and/or the chamber walls for locating a, the or each electrode at a desired location with the plasma chamber.

Preferably, the plasma chamber comprises one or more inlets for introducing a monomer to the plasma chamber.

Preferably, the plasma chamber comprises at least two inlets.

Preferably, each inlet feeds monomer into a monomer distribution system that distributes the monomer evenly across the chamber. For example, the monomer inlet may feed into a manifold which feeds the chamber.

In one embodiment, each inlet is spatially distinct. For instance, a first inlet may be provided in a first wall of the plasma chamber and a second inlet may be provided in a different wall to the first inlet, e.g. the opposite wall.

The apparatus also comprises a monomer vapour supply system. Monomer is vaporized in a controlled fashion. Controlled quantities of this vapour are fed into the plasma chamber preferably through a temperature controlled supply line.

Preferably, the monomer is vaporized at a temperature of from 50° C. to 180° C., more preferably from 100° C. to 150° C., the optimum temperature being dependent on the physical characteristics of the monomer. At least part of the supply line may be temperature controlled according to a ramped (either upwards or downwards) temperature profile. The temperature profile will typically be slightly upward from the point where the monomer is vaporized towards the end of the supply line. In the vacuum chamber the monomer will expand and the required temperatures to prevent condensation in the vacuum chamber and downstream to the pump will typically be much lower than the temperatures of the supply line.

Preferably, the sample chamber can receive or further comprises a perforated container or tray for receiving a substrate to be coated, e.g. a PCB.

Preferably, the substrate to be coated is located on or within the container or tray such that, in use, a polymer coating is applied to each surface of the substrate.

It is preferable that a minimum distance of a few mm, more preferably 10 to 100 mm, for example 15 to 90 mm, say less than 80, 70, 60 or 50 mm, most preferably 25 to 50 mm, is maintained between the outermost electrode and the surface of the substrate to be coated.

Preferably, the polymer layer comprises a superhydrophobic and/or superoleophobic polymer layer.

In the current invention, superhydrophobic surfaces can be created with contact angles for water of more than 100 degrees. The same coatings may be superoleophobic with oil repellency levels above 4, for example up to 8 according to ISO14419.

The invention further provides a system comprising a plasma chamber as described herein.

Preferably, the system comprises one or more gas outlets connected to the pump system.

Preferably, the system comprises at least two gas outlets.

Preferably, the or each gas outlet is positioned in a way that distributes the monomer evenly across the chamber. The gas outlets may communicate with a manifold.

In a second aspect, the invention provides an electrode system for a chamber, e.g. a plasma chamber, for coating a substrate with a polymer layer, the electrode system comprising a first electrode set and a second electrode set, the first and second electrode sets each comprising electrode layers, wherein each electrode set comprises plural radiofrequency electrode layers or plural ground electrode layers for coating polymer to each surface of a substrate.

In a third further aspect, the invention provides a method for coating a substrate with a polymer layer, which method comprises locating a first electrode set and a second electrode set within a plasma chamber; placing a substrate between the first and second electrode sets, wherein the first and second electrode sets comprise electrode layers and wherein each electrode set comprises plural radiofrequency electrode layers or plural ground electrode layers; introducing a monomer into the plasma chamber; switching on the radiofrequency electrode layer or layers in order to activate a plasma; and exposing surfaces of a substrate to the plasma such that a polymer layer is deposited on each surface.

Although we neither wish nor intend to be bound by any particular theory, we understand that the plasma created in between electrode sets of the invention cannot be described as either a pure primary or as a pure secondary plasma. Rather, we consider that the electrode sets create a new hybrid form of plasma which is strong enough to start and maintain a polymerisation reaction at very low power, but which at the same time is benign enough not to break down the reactive monomers.

As will be appreciated, a useful and unique aspect of this invention is that it is possible to establish a plasma on both sides of an article, e.g. a PCB, to be coated when positioned between two electrode sets. Moreover, the generated plasma has a similar, preferably the same, intensity on each side of the article, and hence will initiate the same or similar coating thickness.

Preferably, the monomer strikes the plasma to form the deposited polymer coating, in which case there is no need for an additional gas to strike the plasma, as is described in prior art.

The method of deposition may comprise any one of low pressure plasma polymerisation, atmospheric pressure plasma polymerisation, plasma enhanced chemical vapour deposition (PECVD), CVD or atomic layer deposition (ALD) or any other method of using a plasma chamber to apply a uniform coating having a thickness of less than typically 100 nm.

The preferred method of deposition is low pressure plasma polymerisation.

Preferably, the method comprises applying a polymer coating having a thickness of from 10 to 500 nm, more preferably of from 10 to 200 nm, even more preferably of from 20 to 100 nm, e.g. most preferably of from 30 to 70 nm, 30 to 60 nm, 40 to 60 nm, or 40 to 50 nm. The layer may be less than 500 nm, for example, less than 450, 400, 350, 300, 250, 200, 150, 100, 90, 80, 70, 60, 50, 40 nm.

Preferably, the method comprises applying a polymer coating having a uniformity variation of less than 10%.

In the current invention, superhydrophobic surfaces can be created with contact angles for water of more than 100 degrees. The same coatings are superoleophobic with oil repellency levels above 4, for example up to 8 according to ISO14419.

Preferably, the method comprises the step of depositing a polymer coating having a contact angle for water of 100° or more and/or an oil repellency level of 4 or more according to ISO14419 in a process time of approximately 2 minutes or less.

Preferably, the method comprises the step of depositing a polymer layer having a thickness of approximately 30 nm in approximately 1 minute or less.

Preferably, the method comprises the step of depositing a polymer layer having a thickness of approximately 40 nm in approximately 2 minutes or less.

For this purpose plates of 12 cm by 10.5 cm were coated, which were superposed with a raster, and on each of the 25 cross sections of this raster a coating thickness measurement was performed by ellipsometry. These data were assumed to have a Gaussian distribution of which the standard deviation was calculated as a measure for coating uniformity. In this context a uniformity variation of less than 10% means that the standard deviation was lower than 10%.

The method may comprise drawing a fixed flow of monomer into the plasma chamber using a monomer vapour supply system. A throttle valve in between the pump and the plasma chamber may adapt the pumping volume to achieve the required process pressure inside the plasma chamber.

Preferably the throttle valve is closed by more than 90% (i.e. to reduce the effective cross section in the supply conduit to 10% of its maximum value) in order to reduce the flow through the chamber and to allow the monomer to become evenly distributed throughout the chamber.

Once the monomer vapour pressure has stabilized in the chamber the plasma is activated by switching on the radiofrequency electrodes.

Alternatively, the method may comprise introducing the monomer into the plasma chamber in a first flow direction; and switching the flow after a predetermined time, for example from 10 to 200 seconds, for example from 30 to 180, 40 to 150 seconds, for example less than 150, 140, 130, 120, 110, 100, 90, 80, 70, 60, 50, 40, 30 or 20 seconds to a second flow direction.

Preferably, further switching of the monomer flow direction may be executed, e.g. flow may be switched back to the first flow direction or to one or more further flow directions.

Preferably, monomer may enter the plasma chamber in the first flow direction for between 20 to 80% of a single process time or 30 to 70% of the time or 40 to 60% of the time or 50% of the time.

Preferably, the monomer may enter the plasma chamber in the second flow direction for between 20 to 80% of a single process time or 30 to 70% of the time or 40 to 60% of the time or 50% of the time.

Preferably, the monomer has the formula (I)

$$C_nF_{2n+1}C_mX_{2m}CR_1Y-OCO-C(R_2)=CH_2 \qquad (I)$$

wherein n is 2 to 9, preferably 2 to 6, m is 0 to 9, X and Y is H, F, Cl, Br or I and $R_1$ is —H or an alkyl, e.g. —$CH_3$, or a substituted alkyl, e.g. an at least partially halo-substituted alkyl, $R_2$ is H or an alkyl, e.g. —$CH_3$, or substituted alkyl, e.g. an at least partially halo substituted alkyl.

Preferably, $R_1$ is H, $R_2$ is $CH_3$, and Y is H or F.

Preferably, m is 1 to 9.

Preferably, the first and second flow directions flow in substantially opposite directions. For instance, during a process, monomer may be introduced into the plasma chamber via walls which are substantially opposite to each another.

Preferably, the coating is applied to one or more surfaces of the substrate.

In a fourth aspect, the invention provides a plasma chamber for coating a substrate with a polymer layer, the plasma chamber comprising plural electrode sets arranged successively therein from one end of the plasma chamber to an opposed end of the plasma chamber, wherein the electrode sets closest to each end of the plasma chamber comprise at least three electrode layers.

In a fifth aspect, the invention provides a method for coating a substrate, e.g. a PCB, with a polymer layer, which method comprises subjecting a monomer to a low power continuous or pulsed wave plasma polymerisation technique, wherein the monomer comprises the general formula (II)

$$C_nF_{2n+1}C_m X_{2m}CR_3Y\text{—}OCO\text{—}C(R_4)\text{=}CH_2 \quad (II)$$

wherein n is 2 to 9, preferably 2 to 6, m is 0 to 9, X and Y are H, F, Cl, Br or I, $R_3$ is H or alkyl, e.g. —$CH_3$, or a substituted alkyl, e.g. an at least partially halo-substituted alkyl, and $R_4$ is an alkyl, e.g. —$CH_3$ or a substituted alkyl, e.g. an at least partially halo-substituted alkyl.

In a sixth aspect, the invention provides the use of a monomer to form a solder-through polymer coating when the monomer is subjected to a low pressure plasma polymerisation technique, the monomer having the general formula (I).

In a seventh aspect, the invention provides a substrate comprising a solder-through polymer layer formed by depositing a monomer using a low power continuous or pulsed wave plasma polymerisation technique, wherein the monomer comprises the general formula: $C_nF_{2n+1}C_m X_{2m}CR_3Y$—OCO—$C(R_4)$=$CH_2$, wherein n is 2 to 9, preferably 2 to 6, m is 0 to 9, X and Y are H, F, Cl, Br or I, $R_3$ is H or alkyl, e.g. —$CH_3$, or a substituted alkyl, e.g. an at least partially halo-substituted alkyl; and $R_4$ is —H or an alkyl, e.g. —$CH_3$ or a substituted alkyl, e.g. an at least partially halo-substituted alkyl.

Preferably, the solder-through polymer layer has a thickness of from 10 to 500 nm.

Preferably, the solder-through polymer layer has a thickness of from 10 to 200 nm.

Preferably, the solder-through polymer layer has a thickness of from 20 to 100 nm.

Preferably, the solder-through polymer layer has a thickness of from 40 to 70 nm.

Preferably, the solder-through polymer layer comprises a superhydrophobic and/or superoleophobic polymer layer.

Preferably, the superhydrophobic polymer layer has a contact angle for water of 100° or more.

Preferably, the superoleophobic polymer layer comprises an oil repellency level of 4 or more according to ISO14419.

In the current invention, superhydrophobic surfaces can be created with contact angles for water of more than 100 degrees. The same coatings may be superoleophobic with oil repellency levels above 4, for example up to 8 according to ISO14419.

Preferably, one or more surfaces of the substrate comprise the solder-through polymer layer.

Preferably, the solder-through polymer layer has a uniformity variation of less than 10%.

In an eighth aspect the invention provides the use of a monomer to form a solder-through polymer coating when the monomer is subjected to a low power continuous or pulsed wave plasma polymerisation technique, wherein the monomer comprises the general formula: $C_mF_{2n+1}C_m X_{2m}CR_3Y$—OCO—$C(R_4)$=$CH_2$, wherein n is 2 to 9, preferably 2 to 6, m is 0 to 9, X and Y are H, F, Cl, Br or I, $R_3$ is H or alkyl, e.g. —$CH_3$, or a substituted alkyl, e.g. an at least partially halo-substituted alkyl; and $R_4$ is —H or an alkyl, e.g. —$CH_3$ or a substituted alkyl, e.g. an at least partially halo-substituted alkyl.

Advantages of the inventive chamber, system and/or method include, but are not limited to, one or more of allowing highly reactive classes of monomer to polymerise under low power conditions; maximising diffusion of the monomer within the chamber to provide uniform coatings in quick time; minimising deleterious effects of process gas flow through the chamber; generating a benign plasma which, preferably, has the same intensity on both sides of a substrate such as a PCB; can be used in either low continuous power or pulsed power modes; including a mechanism for alternating the monomer flow during the deposition such that better uniformity is achieved; providing a means for accurately controlling the temperature to avoid undesirable temperature gradients.

BRIEF DESCRIPTION OF THE DRAWINGS

In order that the invention may be more readily understood, it will now be described by way of example only and with reference to the accompanying drawings, in which:

FIG. 2A shows a plan view, FIG. 2B shows a side view and FIG. 2C shows a rear view of a radiofrequency electrode;

FIG. 3A shows a front view.

FIG. 4A shows a front view.

DETAILED DESCRIPTION OF THE INVENTION

Figures 1A, 1B:
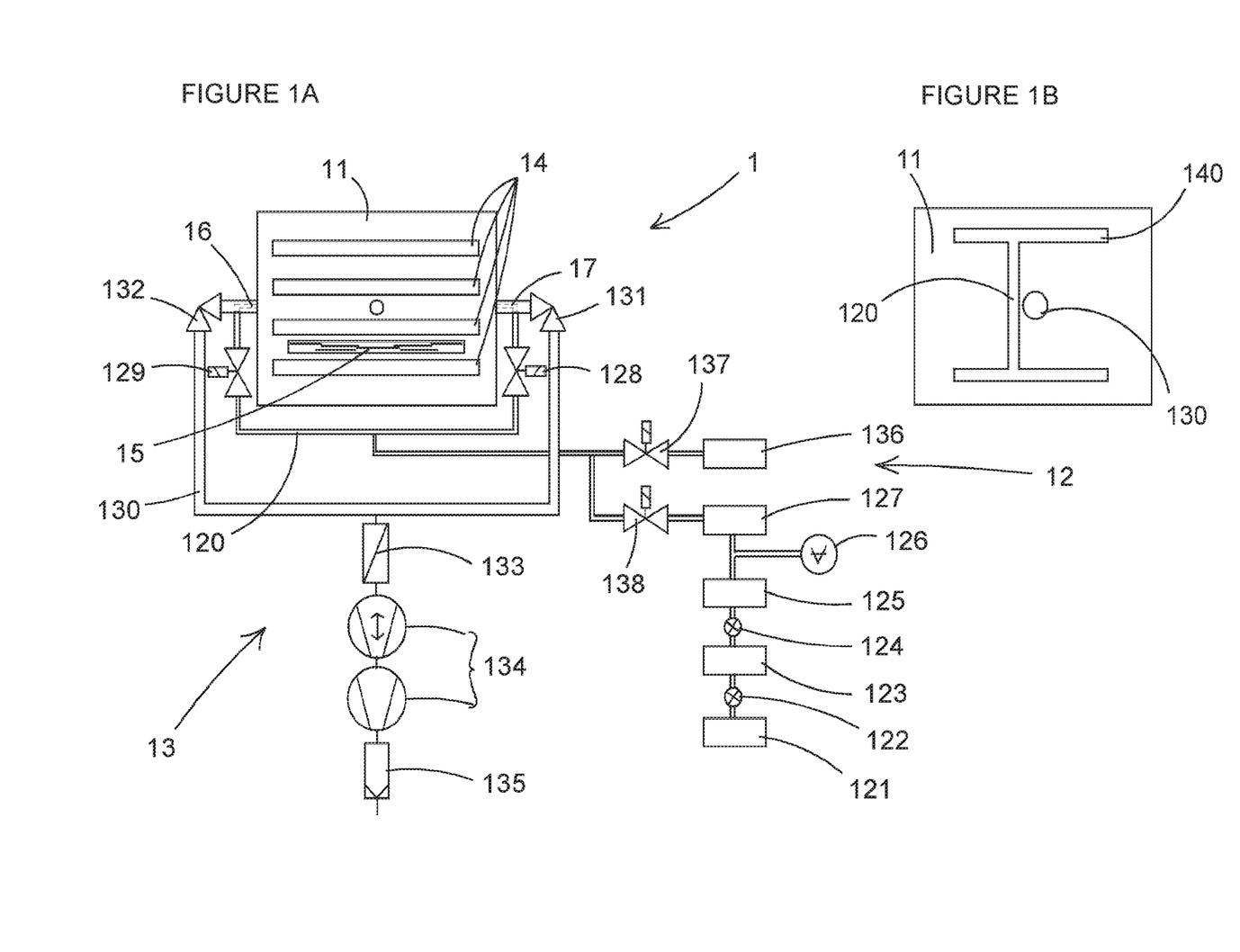
FIGS. 1A and 1B show schematic representations of a system according to the invention.

With reference to FIG. 1A, an inventive plasma deposition system will now be described. The system, indicated generally at 1, comprises a vacuum chamber 11 in communication with input apparatus 12 via an input line 120 and an exhaust apparatus 13 via an output line 130. The input apparatus 12 comprises in flow order a cartridge 121, first 123 and second 125 canisters, a baraton 126, a mass flow controller 127 and first 128 and second 129 chamber inlet valves. The exhaust apparatus 13 comprises in flow order first 131 and second 132 pump valves, a throttle valve 133, a roots and rotary pump 134 and an exhaust valve 135.

Within the vacuum chamber 11 there are four plasma electrode sets 14 arranged in stacked formation. Interposed between each plasma electrode set 14 is a sample tray 15. For purpose of clarity only a single sample tray 15 is shown in FIG. 1, the sample tray 15 being interposed between the lower pair of electrode sets 14. The space between adjacent electrode sets 14 is a sample chamber. In use, one or more PCBs are located on or within the sample tray 15. The sample tray 15 is subsequently positioned between a pair of electrode sets 14 within the vacuum chamber 11.

Once the sample tray 15 is located within the vacuum chamber 11 the chamber 11 is evacuated and a gaseous monomer (or a bespoke mixture of monomers) is introduced. Plasma is then activated within the chamber 11 by energising the electrode sets 14. In the present invention the monomer is used to strike the plasma in order to initiate polymerisation of the monomer onto a surface of the PCB. This is in contrast to prior art methods, which utilise an additional gas to strike the plasma.

Figures 2A, 2C:
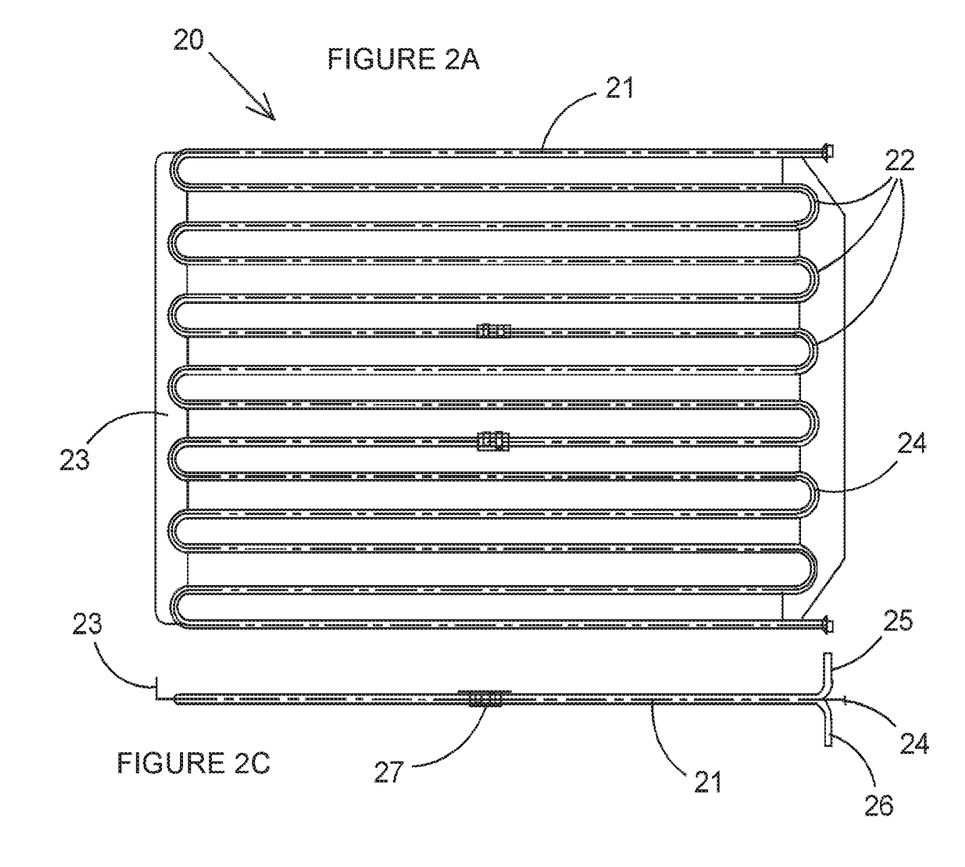
Figure 2B:
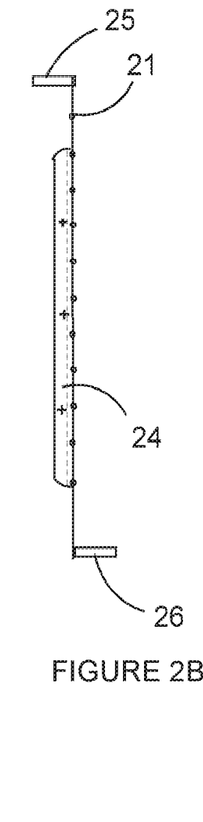

FIG. 2 shows a radiofrequency electrode 20 in plan (a), side (b) and rear (c) views. The radiofrequency electrode 20 comprises a generally planar body formed from folded tubing 21. The tubing 21 may comprise a plurality of sections which are joined together by connectors 27. The tubing 21 is typically formed of a conductive metallic material such as aluminium, stainless steel or copper. The tubing 21 is hollow to allow for a temperature regulation fluid to be passed through the electrode 20 to regulate the plasma at a predetermined temperature. The tubing 21 comprises a series of bends 22 formed at regular intervals along the tubing length. The tubing 21 curves back on itself at each bend 22 by approximately 180°. The tubing 21 has a diameter of approximately 10 mm and a wall thickness of approximately 2 mm. The distance between the tubing 21 before and after each bend 22 is approximately 5 times the diameter of the tubing 21.

The tubing 21 is curved at each end so as to provide distal portions 25, 26 which are substantially orthogonal to the planar body. The distal portions 25, 26 may be connected to a fluid supply or egress line (not shown). Alternatively, the distal portions 25, 26 may be connected to the distal portions of adjacent or nearby electrodes.

The electrode 20 further comprises a pair of connecting plates 23, 24 attached to the front and rear of the electrode 20 and adjacent the bends 22. The connecting plates 23, 24 provide both a means for attaching the electrode 20 to the inside of the vacuum chamber 11 and electrical contacts for applying a load thereto.

Referring back to FIG. 1, examples of inventive processes will now be described. Initially, the chamber 11 is reduced to a base level vacuum, typically 20 mTorr, by means of the pump 134 with the first 131 and second 132 pump valves open and the first 128 and second 129 chamber inlets valves closed. A quantity of monomer is transferred from the cartridge 121 to the first canister 123 by means of a feed pump 122. Typically, sufficient monomer for a single day of processing is transferred at once. The monomers used are preferably in liquid form. Sufficient monomer required for a single process run is then transferred from the first canister 123 to the second canister 125 via a metering pump 124. The temperature of the second canister 125 and thus the monomer is raised, typically to between 130 and 150° C. in order to vaporise the monomer. The chosen temperature of the second canister 125 is dependent on the vapour pressure of the monomer, which is measured by the heated vacuum gauge 126.

In alternative embodiments, solid or gaseous monomer may be used. In embodiments where the monomer is a solid then it may also vaporised, e.g. by heating in a canister. In embodiments where the monomer is a gas then there is typically no need for vaporisation.

Once the target pressure within the vacuum chamber 11 is reached, typically between 40 to 50° C., the first pump valve 131 is closed and the first chamber inlet valve 128 is opened. Consequently, when the valve 138 is open, monomer vapour produced in the second canister 125 passes through the mass flow controller 127 and into chamber 11. The pressure within the chamber 11 is regulated at a working level of typically 10 to 1000 mTorr by either introduction of more monomer or regulation of the throttle valve 133, which is typically a butterfly valve.

Once the pressure within the chamber 11 is stable, the electrode sets 14 are activated to generate plasma within the chamber 11. Thus, the monomer is activated and polymerisation occurs on a surface of the PCB. Preferred monomers comprise a high concentration of perfluorocarbon chains and are therefore highly reactive in the plasma. As such, polymerisation occurs rapidly even at low power and low monomer flow rates, typically 60 to 80 W and 30 to 50 standard cubic centimetres per min (sccm), respectively. Sufficient monomer is usually polymerised after approximately 60 to 120 seconds, to give a desired coating thickness of approximately 70 nm, depending on the power mode chosen.

During the process, the direction of monomer flow through the chamber 11 is switched by control of the first 128 and second 129 chamber inlet valves and first 131 and second 132 pump valves. For example, for half the time the first chamber inlet valve 128 is open and the first pump valve 131 is closed (with the second chamber inlet valve 129 closed and second pump valve 132 open). For the remainder of the time, the second chamber inlet valve 129 is open and second pump valve 132 closed (with the first chamber inlet valve 128 closed and the first pump valve 131 open). This means that for half the time monomer flows from one side of the chamber 11 to another and for the remainder of the time vice versa. For example, for half the time monomer flows from the right to the left and for the remainder of the time monomer flows from the left to the right. The direction of monomer flow may be alternated one or more times during a single process run.

FIG. 1B shows a view from the side of the chamber 11 of FIG. 1A. As will be appreciated the inlet 120 and outlet 130 lines are separate from each other. The inlet line 120 may be coupled to a distribution system 140 arranged to distribute gas across the chamber 11. The distribution system 140 may be integrated on or within the wall of the chamber 11 so that it can be maintained at the same temperature as the chamber 11. Further, in preferred embodiments the outlet line 130 is typically arranged to be closer to the door of the chamber 11 (rather than the rear of the chamber) to compensate for the fact that the intensity of the plasma tends to be higher at regions closer to the electrode connection plates 23.

An alternative process will now be described. A fixed charge of monomer is transferred to the chamber 11 via the spatially separated ports 16, 17 whilst the inlet valves 128, 129 and pump valves 131, 132 are open. Once the chamber 11 is filled with monomer the pump valves 131, 132 are closed to allow the monomer to become evenly distributed within the chamber 11. Even distribution of the monomer results in a more evenly fragmented monomer in the plasma. The pump valves 131, 132 are then opened to allow the residual monomer to be extracted from the chamber 11 and the plasma initiated. This "diffusion process" is repeated several times, 1 to 20, preferably 3 to 7, for instance 5, and results in a more uniform coating of the surface and is considerably less sensitive to the orientation of the surface than conventional methods, making this process particularly well suited to three dimensional structures and vias, including microvias. Surface tension effects limit the smallest diameter of microvias that conventional wet chemistry can be used for. Plasma deposition, which is a dry gaseous process, completely eliminates the effects of surface tension, allowing coatings to be applied to even the smallest of microvias.

In some embodiments of the invention it is preferable to introduce an inert gas to the chamber 11 with the monomer in order to prevent or at least inhibit fragmentation of the monomer.

At the end of either process it is recommended for operator safety that the chamber inlet valves 128, 129 are closed and the chamber 11 pressure is reduced to base level to remove any residual monomer present. An inert gas such as nitrogen is introduced from a third canister 136 by opening valve 137. The nitrogen is used as a purge fluid and is pumped away with the residual monomer. After completion of the purge, the vacuum is removed and air is introduced into the chamber 11 until atmospheric pressure is achieved.

After one or more process cycles it is recommended to purge the monomer supply line with inert gas. An inert gas line (not shown) can be connected to the or each canister to do this. It is preferable to purge the supply line straight to the pump (rather than via the chamber) so that the purge may be performed whilst the chamber is being loaded and/or unloaded.

Figure 3A:
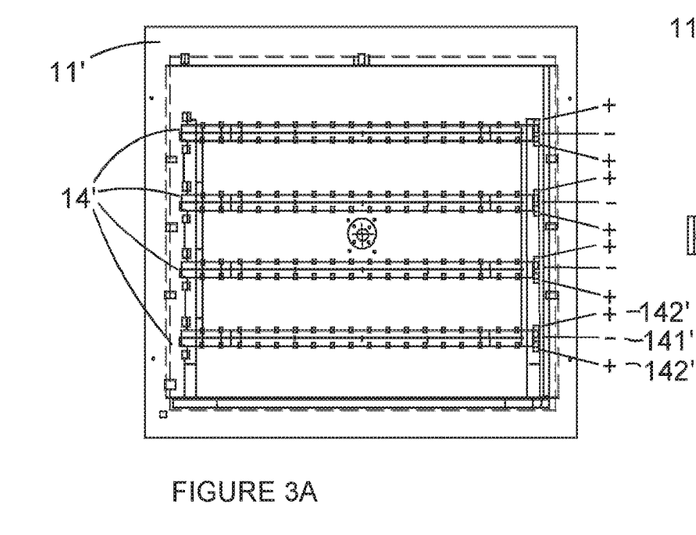
Figure 3B:
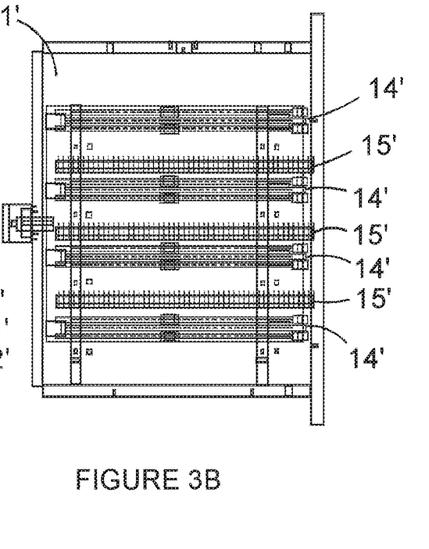
FIG. 3B shows a side view and FIG. 3C shows a plan view of a vacuum chamber according to the present invention.
Figure 3C:
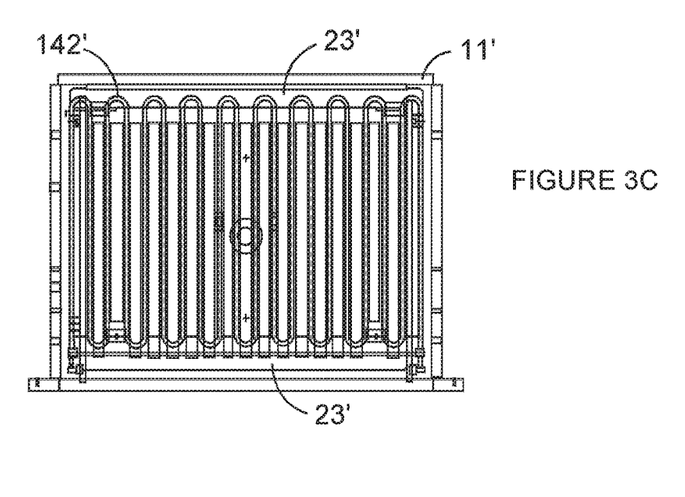
Figure 4A:
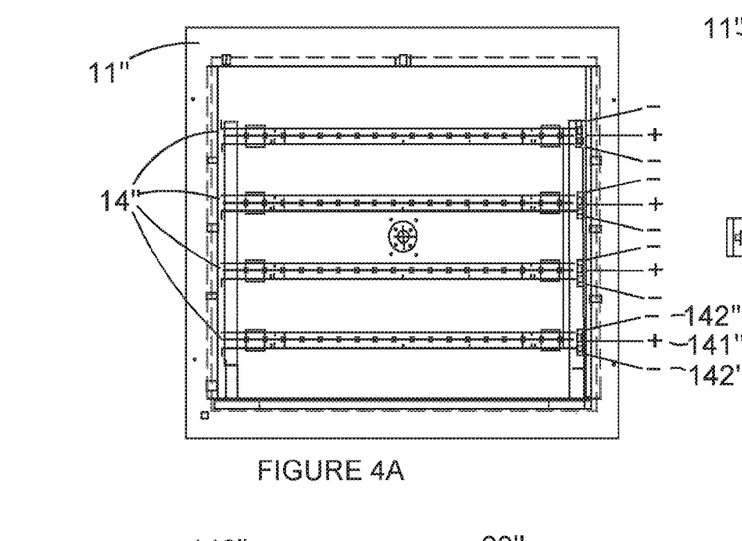
Figure 4B:
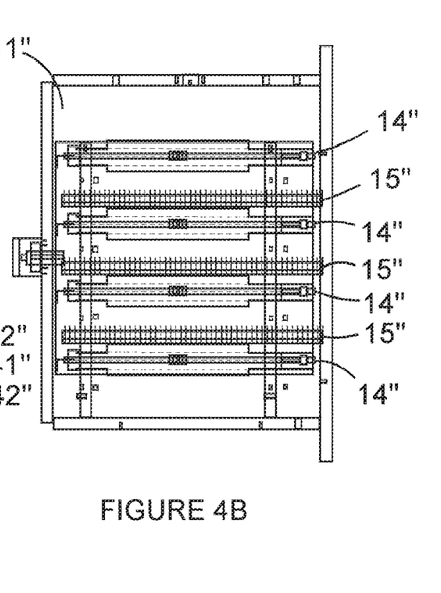
FIG. 4B shows a side view and FIG. 4C shows a plan of another vacuum chamber according to the present invention.
Figure 4C:
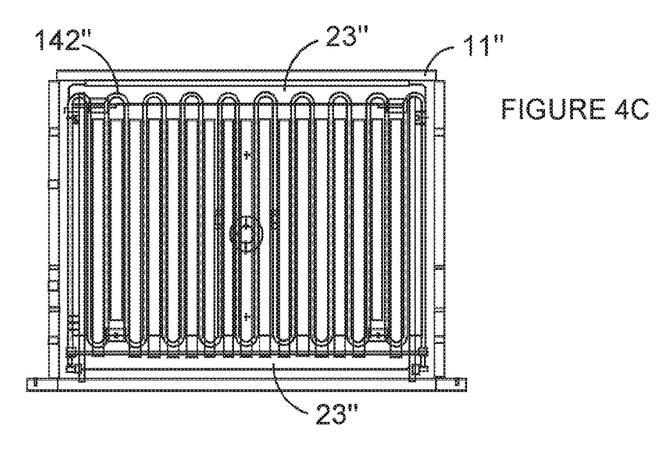
Figure 5A:
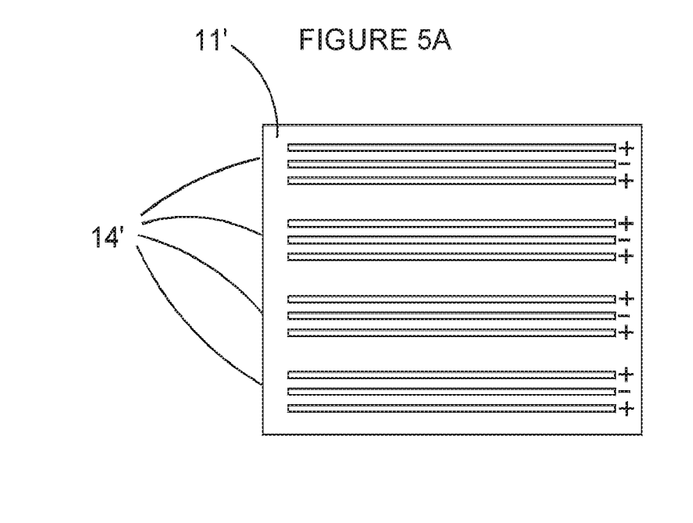
FIG. 5A and FIG. 5B show schematic representations of electrode set arrangements according to first (5A) and second (5B) embodiments of the invention.
Figure 5B:
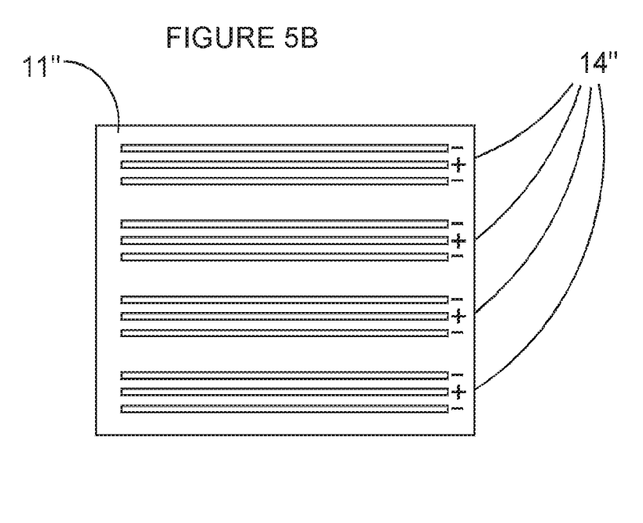

There are several possible ways of configuring the electrode layers of each electrode set 14. FIGS. 3 to 5 exemplify two possible configurations.

FIGS. 3A to 3C show a first preferred arrangement in which four electrode sets 14' are located within a plasma chamber 11'. The electrode sets 14' are identical to one another and therefore only one shall be described in detail. The electrode set 14' comprises an inner electrode layer 141' and a pair of outer electrode layers 142'. The outer electrode layers 141' comprise a radiofrequency electrode of the type shown in FIG. 2 and the inner electrode layer 142' comprises a ground type electrode, e.g. a plate electrode. The three layers 141', 142' are coupled to form a distinct electrode. In use, load is only applied to the outer layers 142'. FIG. 3B shows the same arrangement as FIG. 3A only in FIG. 3B sample trays 15' are also shown in the chamber 11'.

FIGS. 4A to 4C show a second preferred arrangement in which four electrode sets 14" are located within a plasma chamber 11". The electrode sets 14" are identical to one another and therefore only one shall be described in detail. The electrode set 14" comprises an inner electrode layer 141" and a pair of outer electrode layers 142". The outer electrode layers 142" each comprise a ground electrode and the inner electrode layer 141" comprises a radiofrequency electrode layer of the type shown in FIG. 2. The three layers 141", 142" are coupled to form a distinct electrode. In use, load is only applied to the inner layer 141". FIG. 4B shows the same arrangement as FIG. 4A only in FIG. 4B sample trays 15" are also shown in the chamber 11".

The electrode sets 14', 14" may be termed "tri-electrodes".

FIG. 5 shows simplified schematics of the first (a) and second (b) preferred arrangements of FIGS. 3 and 4, respectively. As will be appreciated the radiofrequency electrode layers are depicted by (+) and the ground electrode layers are depicted by (−).

The applicant has discovered that use of an electrode set arrangement of the type shown in FIGS. 3 to 5 further improves the uniformity of the deposited polymer coating.

It is known that when halo hydrocarbon layers are deposited on a metal the free fluoride ions combine with metal ions to form a thin layer of metal fluoride. This metal fluoride functions as a flux. Thus, it is desirable to maximise the thickness of this layer in order to make subsequent soldering operations easier.

One limitation on the thickness of this metal halide layer is the amount of free fluoride present in the plasma. However, because the monomers of the invention comprise high concentrations of perfluorocarbon chains the concentration of fluoride available to combine with the copper is greater than that observed in the prior art. Therefore, thicker layer of copper fluoride forms between the conductive tracks and the polymer coating.

This flux has a number of advantages, including
(i) removal of the coating to allow components to be soldered to the conductive tracks;
(ii) removal of any contamination from the copper tracks;
(iii) to prevent oxidation as the temperature is raised to the solder reflow point; and
(iv) to act as an interface between the liquid solder and the cleaned copper tracks.

It is not unusual for moisture and other gasses to be present within the structure of a PCB. If a polymeric coating is applied to a PCB, then this moisture becomes trapped and can cause various problems during soldering and also subsequently when the assembled PCBs are subjected to temperature variations. Trapped moisture may result in increased leakage currents and electromigration.

It is essential to remove any trapped gases or moisture from the bare PCB; this also ensures good adhesion between the polymer coating and the PCB. Removal of trapped gasses or moisture can be carried out by baking the structure prior to placing it in a plasma chamber as in conventional conformal coating techniques. The invention described here enables this de-gassing, at least partially to be carried out in the same chamber as the precleaning, etching and plasma polymerization.

The vacuum helps to remove moisture from the structure which improves the adhesion and prevents problems encountered in heat cycling during the lifetime of the products. The pressure range for degassing can be from 10 mTorr to 760 Torr with a temperature range from 5 to 200° C., and can be carried out for between 1 and 120 min, but typically for a few minutes.

The degassing, activation and coating processes can all be carried out in the same chamber in sequence. An etching process can also be used to eliminate surface contamination of the copper prior to the activation and coating steps.

The conductive tracks on the substrate may comprise any conductive material including metals, conductive polymers or conductive inks. Conductive polymers are hydrophilic in nature, resulting in swelling, which can be eliminated by applying the coating described herein.

Solder resists are normally applied to PCB's during the manufacturing process, which serve to protect the metallic conductors from oxidation and to prevent the solder flowing up the metallic track, which would reduce the amount of solder in the joint. Solder resists also reduce the potential for solder shorts between adjacent conductors. Because the halocarbon polymer coating is only removed where flux is applied, a very effective barrier to corrosion is left across the rest of the board, including the metallic conductors. This action also prevents the solder flowing up the track during the soldering process and minimises the potential for solder bridges between conductors. Consequently, in certain applications, the solder resist can be eliminated.

In order to further demonstrate features of the invention, reference is made to the following Examples.

Example 1

An experiment was run to coat a substrate using the parameters of Table 1.

TABLE 1

Process parameters according to a first example

| Parameter | Value |
|---|---|
| Liquid Monomer Supply (LMS) | |
| Temperature_canister | 130-150° C. |
| Temperature_LMS | 140-150° C. |
| Plasma Chamber | |
| Dimensions | 700 × 730 × 960 mm |
| Temperature wall | 40-50° C. |
| Electrodes & Generator | |
| Plasma | RF/ground |
| Power | 60-80 W |
| Frequency | 13.56 MHz |
| Frequency mode | cw |
| Monomer | 1H,1H,2H,2H-Perfluorooctyl methacrylate |
| flow | 10-50 sccm |
| Pressure | |
| Base pressure | 10-20 mTorr |
| Work pressure | 45-55 mTorr |
| Oleophobicity Level (ISO 14419-2010) | 5 |

Example 2

A further experiment was run to coat a substrate using the parameters of Table 2.

TABLE 2

Process parameters according to a second example

| Parameter | Value |
|---|---|
| Liquid Monomer Supply (LMS) | |
| Temperature_canister | 130-150° C. |
| Temperature_LMS | 130-150° C. |
| Chamber | |
| System | 700 × 730 × 960 mm |
| Temperature_wall | 40-50° C. |
| Electrodes & Generator | |
| Plasma | RF/ground |
| Power | 60-100 W |
| Frequency | 13.56 MHz |
| Frequency mode | pulsed ($10^2$-$10^4$ Hz; duty cycle 0.1-20%) |
| Precursor | 1H,1H,2H,2H-Perfluorodecyl acrylate |
| flow | 10-50 sccm |
| Pressure | |
| Base pressure | 10-20 mTorr |
| Work pressure | 40 mTorr |
| Throttle valve | 20-30% |

TABLE 2-continued

Process parameters according to a second example

| Parameter | Value |
|---|---|
| Oleophobicity Level (ISO 14419-2010) | 8 |

Results

1. Oil and Water Repellence

The water contact angle is used to measure the hydrophobicity or wettability from a surface.

The oleophobicity level is measured according ISO 14419-2010.

TABLE 3

Oil and water repellence test data

| Precursor | $C_3F_6$ | Ex 1 | Ex 2 |
|---|---|---|---|
| Contact angle° | 90°-100° | 100°-110° | 110°-120° |
| Oleophobic level | 3 | 5 | 8 |
| Process parameters | | | |
| Time (minutes) | 10 | 2 | 2 |
| Work pressure (mTorr) | 50 | 50 | 40 |
| Power (W) | 500 | 75 | 75 |
| Flow (sccm) | 100 | 25 | 25 |

It is clear from Table 3 that the hydrophobicity, as measured by the contact angle, is higher in the cases of the invention than for the prior art precursor. It is further established that the coatings of the invention have a higher oleophobicity than the prior art coating. It is also noteworthy that the process time for the coatings of the invention, power and flow rate were all lower in developing the coatings of the invention than in the prior art case.

Table 3 also demonstrates that coatings formed from precursors having perfluorocarbon backbones comprising eight carbons, such as 1H,1H,2H,2H—Perfluorodecyl acrylate, have higher oleophobicity and hydrophobicity than coatings formed from precursors having perfluorocarbon backbones comprising six carbon atoms, such as 1H,1H,2H,2H—Perfluorooctyl methacrylate.

Surprisingly, however, the Applicant has found that optimum coatings are deposited when the mode (i.e. continuous wave or pulsed) is selected according to the following key (Table 4).

TABLE 4

Mode optimisation key

| | | perfluorocarbon chain length | |
|---|---|---|---|
| | | C2-C6 | C7+, e.g. C7-C8 |
| monomer type | acrylate | cw | pulsed |
| | methacrylate | cw | pulsed |

2. Deposition Rate

To demonstrate the deposition rate of different coatings, the coating thickness was measured with ellipsometry after a certain treatment time on coated glass plates. The results are shown in Table 5 below.

TABLE 5

Deposition rate test data

| Precursor | $C_3F_6$ | Ex 1 | Ex 2 |
|---|---|---|---|
| Thickness (nm) | 28.4 | 29.9 | 35.8 |
| Process time (minutes) | 7 | 1 | 1 |
| Process parameters | | | |
| Work pressure (mTorr) | 50 | 50 | 40 |
| Power (W) | 500 | 75 | 75 |
| Flow (sccm) | 100 | 25 | 25 |

The process time is approximately seven times higher for $C_3F_6$ than for the coatings of the invention.

3. Uniformity of Coating for Single and Plural Electrodes

A conventional electrode set up was established with a single electrode per electrode set. In such conventional configurations the top side of the substrate or the side facing towards the RF has a thicker coating formed thereon than the obverse face or face pointing to the ground electrode.

TABLE 6

Uniformity test data

| Precursor | 1H,1H,2H,2H-Perfluorooctyl methacrylate | |
|---|---|---|
| electrodes/set | Single[1] | Multiple[2] |
| Thickness: | | |
| Top (nm) | 58.9 | 64.2 |
| Bottom (nm) | 25.3 | 66.1 |
| Process parameters: | | |
| Process time (minutes) | 2 | 2 |
| Work pressure (mTorr) | 50 | 50 |
| Power (W) | 75 | 160 |
| Flow (sccm) | 25 | 25 |

[1] A single electrode system is one conventionally used in the prior art
[2] A multiple electrode system is that as shown in the accompanying figures As can be seen in the above Table 6, the data demonstrates that the electrode configuration of the invention leads to markedly more consistent coverage on both surfaces of the substrate.

4. Coating Uniformity According to the Precursor

In order to determine the coating uniformity, process parameters were optimised for a prior art substance ($C_3F_6$) and a coating of the invention (1H,1H,2H,2H—Perfluorodecyl acrylate).

The minimum standard deviation for the prior art substance was 25%. The standard deviation for the coating of the invention was 6.75%.

Figure 7:
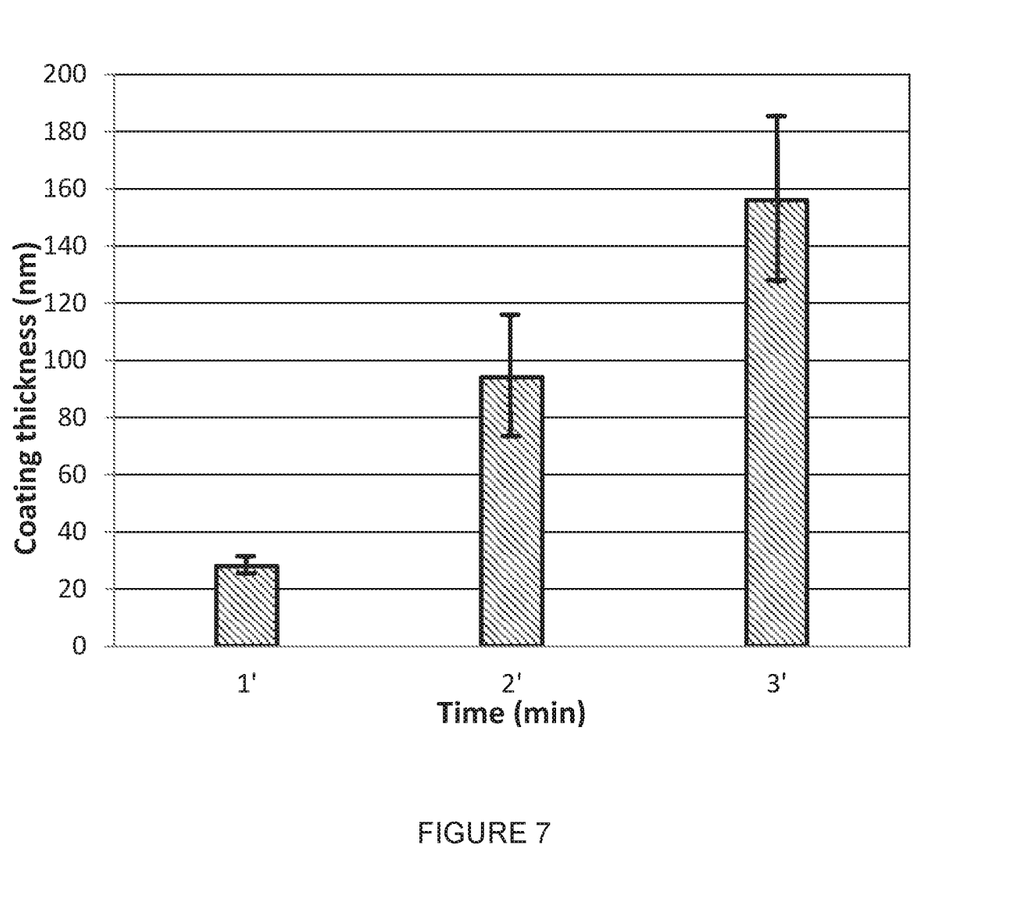
FIG. 7 is a graph of coating thickness against time.

The coating of the invention was applied at a lower power than that of the prior art (ca. five times less). It was also coated with a lower treatment time. The graph of FIG. 7 demonstrates that the uniformity for coatings of the invention is higher when process times are shorter (the error bars at long process times are larger than at short process times).

5. Solderability from Plasma Coated PCB

Different coating thicknesses were evaluated regarding the solderability. For coatings of the invention (e.g. 1H,1H,2H,2H—Perfluorodecyl acrylate) (in pulsed or continuous power mode) the PCB joints soldered well. It was found that a wide range of coating thicknesses, in this experiment from 10 to 170 nm, showed good solderability.

6. Corrosion Resistance

To test the corrosion resistance, a single gas verification test was used that had been developed as a quick and effective method of evaluating gold and nickel coatings on copper.

The samples were placed in a chamber that had been filled with $H_2SO_3$ and the chamber was then placed in an oven at 40° C.

After 24 hours the samples were removed from the chamber and photographed.

The samples were replaced in the chamber which was refilled with a fresh charge of $H_2SO_3$. The chamber was put back in the oven and the temperature increased to 45° C. The chamber was kept at this temperature for a further four days, when some limited corrosion started to appear on the polymer coated samples.

Further photographs of the samples were taken at the end of the test.

The result shows that after 24 hours the ENIG-reference PCB was showing sufficient corrosion to make it unusable whereas the coatings of the invention (Examples 1 and 2 above) plasma treated samples showed no signs of corrosion. After a further four days, the ENIG reference sample was heavily corroded with large areas of copper oxide and nickel showing through. By contrast, the coatings of the invention (Examples 1 and 2 above) showed no corrosion at all or just some tiny spots. In this experiment different precursor types, different coating thickness as well as different power modes (continuous or pulsed) showed the same excellent results.

Figure 6A:
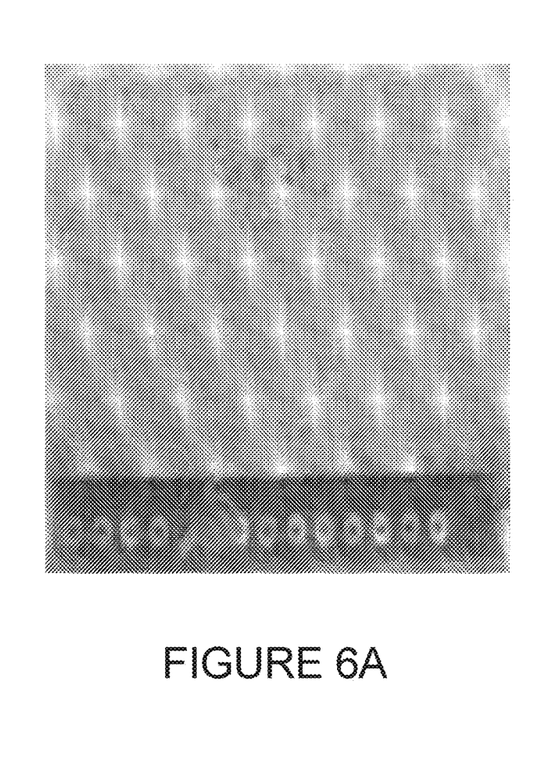
FIGS. 6A and 6B are photographs of a comparative test.
Figure 6B:
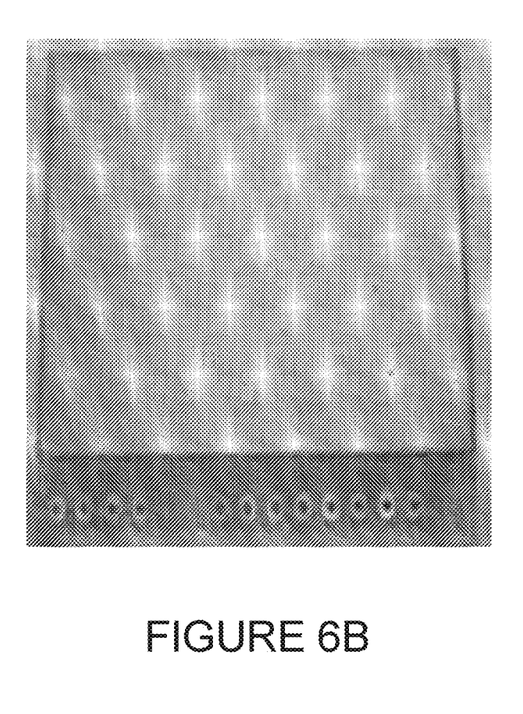

Reference is made to FIG. 6 which shows the ENIG reference (FIG. 6A) and plasma coating of the invention (FIG. 6B) after the test.

7. Wettability

The wettability of the Example 1 plasma coated PCB was shown according to following method IPC JSTD-003B.

The test coupons were dipped in solder paste: SnPb at 235° C. or SAC305 at 255° C. Test fluxes 1 and 2 were used for SnPb and SAC305 respectfully. Samples were used as a baseline tested at 90 degrees incident to the solder pot. The immersion depth was 0.5 mm and the dwell time in the solder pot was 10 seconds. A series of samples were additionally exposed to 8*h* of 72° C./85% R.H. in a humidity chamber.

All of the test coupons showed good wetting and robustness of the coating.

The current invention demonstrates that the use of reactive monomers is effective in providing improved coatings. Moreover, the use of low powers and fast process times provides homogeneous coatings with excellent performance characteristics.

What is claimed is:

1. A method for coating a substrate with a polymer layer, which method comprises:
   locating a first electrode set and a second electrode set within a plasma chamber, wherein each electrode set comprises an inner electrode layer and a pair of outer electrode layers and wherein the inner electrode layer is a radiofrequency electrode layer and the outer electrode layers are ground electrode layers respectively;
   placing a substrate between the first and second electrode sets so that an outer electrode layer of each electrode set faces the substrate;
   introducing a monomer into the plasma chamber;
   actuating each said radiofrequency electrode layer in order to activate a plasma; and exposing surfaces of the substrate to the plasma such that a polymer layer is deposited on each surface.

2. The method of claim 1, further comprising the step of initiating polymerization of the monomer by striking the plasma with the monomer to form the polymer layer.

3. The method of claim 1, further comprising the step of applying the polymer layer to a thickness of from 10 to 500 nm.

4. The method of claim 1, further comprising the step of applying the polymer layer to a thickness of from 10 to 200 nm.

5. The method of claim 1, further comprising the step of applying the polymer layer to a thickness of from 20 to 100 nm.

6. The method of claim 1, further comprising the step of applying the polymer layer to a thickness of from 40 to 70 nm.

7. The method of claim 1, further comprising drawing a fixed flow of the monomer into the plasma chamber using a monomer vapor supply system.

8. The method of claim 1, further comprising the step of allowing a vapor pressure of the monomer to stabilize in the plasma chamber before activating the plasma by actuating each said radiofrequency electrode layer.

9. The method of claim 1, further comprising the step of introducing the monomer into the plasma chamber in a first flow direction; and switching the flow after a predetermined time to a second flow direction.

10. The method of claim 1, further comprising the step of depositing the polymer layer such that it has a contact angle for water of 100° or more and/or an oil repellency level of 4 or more according to ISO14419 in a process time of approximately 2 minutes or less.

* * * * *